United States Patent [19]
Iverson

[11] Patent Number: 5,242,507
[45] Date of Patent: Sep. 7, 1993

[54] IMPURITY-INDUCED SEEDING OF POLYCRYSTALLINE SEMICONDUCTORS

[75] Inventor: Ralph B. Iverson, Somerville, Mass.

[73] Assignee: Boston University, Boston, Mass.

[21] Appl. No.: 700,333

[22] Filed: May 6, 1991

Related U.S. Application Data

[63] Continuation of Ser. No. 333,650, Apr. 5, 1989, abandoned.

[51] Int. Cl.$^5$ .......................................... H01L 29/00
[52] U.S. Cl. ................................... 148/33; 148/33.2; 437/109; 437/233; 437/247; 257/49
[58] Field of Search ................. 148/33, 33.2; 437/109, 437/233, 247; 357/59

[56] References Cited

U.S. PATENT DOCUMENTS

| | | | |
|---|---|---|---|
| 4,379,020 | 4/1983 | Glaeser et al. | 437/233 |
| 4,693,759 | 9/1987 | Noguchi et al. | 437/923 |
| 4,755,865 | 7/1988 | Wilson et al. | 357/59 G |
| 4,762,801 | 8/1988 | Kapoor | 437/247 |
| 4,952,526 | 8/1990 | Dribat et al. | 148/DIG. 164 |
| 4,959,700 | 9/1990 | Yamazaki | 357/23.7 |

FOREIGN PATENT DOCUMENTS

| | | | |
|---|---|---|---|
| 61-119079 | 6/1986 | Japan. | |
| 62-214669 | 9/1987 | Japan. | |
| 1-011369 | 1/1989 | Japan. | |
| 2171844A | 9/1986 | United Kingdom | 437/109 |

OTHER PUBLICATIONS

M. T. Duffy et al., "LPCVD Polycrystalline Silicon: Growth and Physical Properties of . . .", RCA Review, vol. 44, Jun. 1983, pp. 313-325.

H. F. Bare et al., "Ion Implanted Contacts to a —Si:H Thin-Film Transistors", IEEE Electron Device Letters, vol. 7, No. 7, Jul. 1986.

S. J. Krause et al., "Effect of Transient Annealing on Grain Growth and Structure of Polycrystalline Si Films", Inst. Phys. Conf. Ser. No. 76, Sec. 3, Mar. 1985, pp. 105-110.

McCarthy et al., "The Properties of Phosphorus in Polycrystalline Si-ANMR Study", Mar. Res. Soc. Symp. Proc., vol. 71, 1986, pp. 375-378.

S. Wolf et al., Silicon Processing for the VLSI Era, Lattice Press, Sunset Beach, CA (1986) pp. 305-306.

R. B. Iverson et al., *Dose Dependence of Crystallization in Implanted Polycrystalline Silicon Films on SiO$_2$*, Applied Physics Letters, vol. 52, No. 8, Feb. 22, 1988, pp. 645-647.

Y. Wade et al., *Grain Growth Mechanism of Heavily Phosphorus-Implanted Polycrystalline Silicon*, Journal of Electrochemical Society: Solid State Science and Technology, Sep. 1978, pp. 1499-1504.

H. Yamamoto et al., *Enhancement of Lateral Solid Phase Epitaxial Growth . . .*, Applied Physics Letters 46 (3), Feb. 1, 1985, pp. 268-270.

K. Zellama et al., *Crystallization in Amorphous Silicon*, Journal of Applied Physics 50 (11), Nov. 1979, pp. 6995-7000.

*Primary Examiner*—Brian E. Hearn
*Assistant Examiner*—Laura M. Holtzman
*Attorney, Agent, or Firm*—Hamilton, Brook, Smith & Reynolds

[57] ABSTRACT

A semiconductor fabrication process improves the crystal structure of a polycrystalline semiconductor. Adding impurities in large quantities causes an acceleration of the crystallization without noticeably increasing the number of spontaneous nucleations in the material. The result is a region of relatively larger crystalline grains within the doped region which extend approximately 1 μm into the undoped region by the time the entire material has crystallized. Junction devices can be created with better electrical characteristics than ordinary polycrystalline semiconductor devices due to fewer grain boundaries at the electrical junctions. One fabrication technique can result in single crystal devices. Another implementation shows a method for fabricating improved polycrystalline vertical diodes such as solar cells.

17 Claims, 5 Drawing Sheets

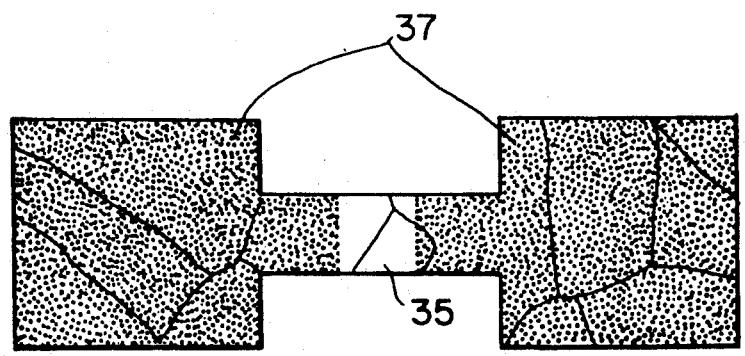
*FIG. 4A*
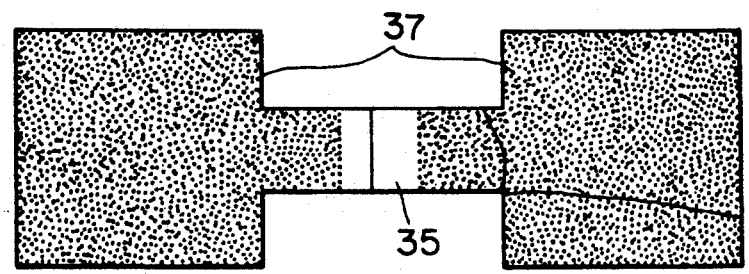
*FIG. 4B*
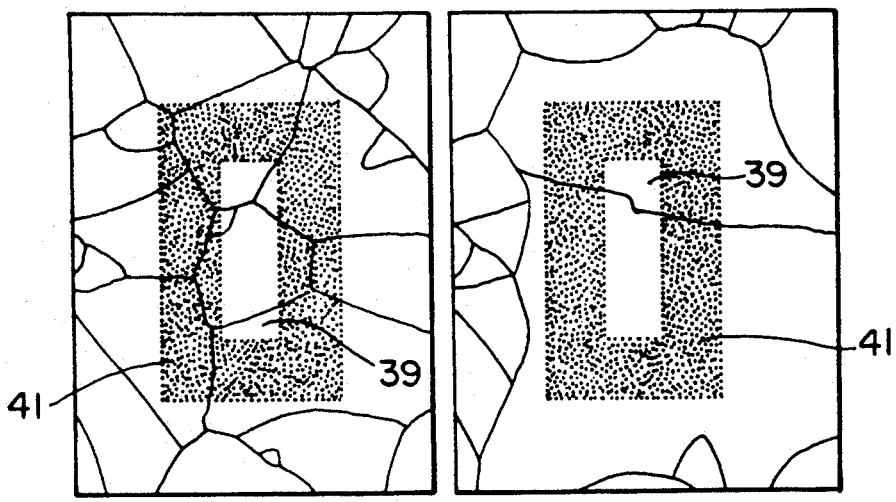
*FIG. 5A*  *FIG. 5B*

IMPURITY-INDUCED SEEDING OF POLYCRYSTALLINE SEMICONDUCTORS

This is a continuation of application Ser. No. 07/333,650 filed on Apr. 5, 1990, now abandoned.

BACKGROUND OF THE INVENTION

Polycrystalline semiconductor devices, although having poorer electrical characteristics than single crystal devices, have the attraction of being much less expensive to manufacture. The grain boundaries between crystals in a polycrystalline device constitute imperfections in the crystalline structure, and can cause increased resistivity and unwanted shunts in an electronic semiconductor device. The number of grain boundaries in a given device is a direct product of the size of the grains in the overall semiconductor body. The degrading effects of grain boundaries are pronounced when the grain boundary crosses a conductivity junction in the device.

In recent years, many methods have been investigated for improving the quality of polycrystalline semiconductors. These methods have principally focused on increasing the grain size. A semiconductor material may be seeded from the substrate through windows in an oxide coating, but this requires an expensive substrate such as sapphire or silicon. High-temperature processes such as liquid-phase crystallization can produce a single crystal structure, but require expensive substrates. Other high temperature methods include graphoepitaxy using a laser or a strip-heater oven and zone-melting.

Low-temperature methods are preferred for polycrystalline semiconductors because an inexpensive substrate, such as glass, may be used. The devices may be stacked with a new layer being fabricated over the old. With low-temperature processing, the layer underneath will not be destroyed by excessive heat. Existing low-temperature methods involve solid-phase nucleation and crystal growth. These methods result in acceptable electron channel mobilities, but the positions of the grain boundaries are not correlated with the conductivity junctions. Therefore, the devices must be much larger than the grain size in order to be well-matched.

SUMMARY OF THE INVENTION

In accordance with the present invention, a method is provided for forming a polycrystalline semiconductor body with a controlled grain structure. This method includes first providing an amorphous semiconductor material. Impurities are then added to predetermined discrete regions of the material which enhance the rate of crystallization in those regions. Finally the material is crystallized by a low-temperature process where all grains are formed by spontaneous nucleation.

This material may be formed on a substrate of glass, silicon dioxide, or some other insulating material. The semiconductor material is generally silicon, but germanium or other semiconductors may be used in this process. Impurities used include phosphous, arsenic, and boron, and may be added by ion implantation, or by diffusion from the surface of the material. Masking is usually used when adding the impurities.

One implementation of the present invention is a semiconductor body which includes a conductivity junction formed by adding impurities to a predetermined, discrete region of a semiconductor body. These impurities enhance the rate of crystallization of this region, resulting in low granularity in the doped region and beyond the conductivity junction. This conductivity junction is often a p-n junction.

A product of the aforementioned method is a semiconductor device which contains a conductivity junction within a crystallized region of relatively low granularity which in turn borders a region of relatively high granularity. With the conductivity junction in the region of lower granularity, the device has better electrical characteristics than if the junction were in a region of higher granularity, although the region of higher granularity may lead to greater device-to-device consistency.

In one variation, the device is fabricated vertically within a semiconductor layer, with the region of low granularity above the region of high granularity, and the conductivity junction being horizontal within the region of low granularity.

Another variation of Impurity-Induced Seeding exists such that with proper masking, a small junction device may be formed in a single grain.

BRIEF DESCRIPTION OF THE DRAWINGS

FIG. 4A shows a semiconductor device structure having a high number of grain boundaries.

FIG. 4B shows a device structure similar to that of FIG. 4A, but using the method of the present invention.

FIG. 5A shows an alternative semiconductor device structure having a high number of grain boundaries.

FIG. 5B shows a structure similar to that of FIG. 5A, but using the method of the present invention.

PREFERRED EMBODIMENT OF THE INVENTION

The following description refers to silicon as the semiconductor material used for the present invention. This is only to aid in the description, and in no way should be construed as a limitation on the invention. This invention is equally effective for other semiconductor materials including germanium.

Figure 1A:
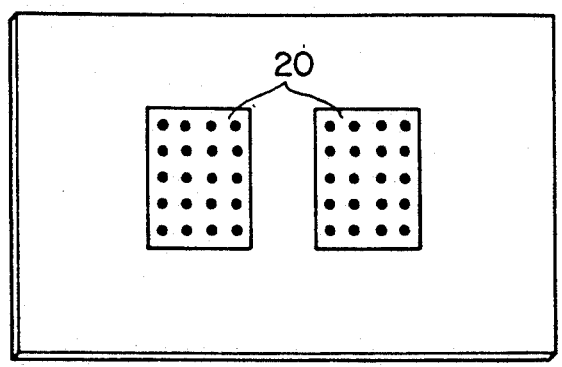
FIGS. 1A–1D demonstrate a typical crystal growth caused by Impurity-Induced Seeding.

The general principal behind Impurity-Induced Seeding is demonstrated in FIGS. 1A to 1D. FIG. 1A shows a thin layer of amorphous silicon which has been deposited on an insulating substrate. The silicon may also be deposited in a polycrystalline state and be amorphized by silicon ion implantation. The figure shows certain predetermined regions 20 of the amorphous silicon layer that are heavily doped with an impurity such as phosphorus, arsenic, or boron. Doping with phosphorus or arsenic yields an n-type semiconductor, while doping with boron yields a p-type semiconductor.

After doping, the material is crystallized by a low-temperature anneal. The anneal temperature is between 600° and 700° Celsius. The addition of the dopants to the selected regions 20 induces rapid grain growth after spontaneous nucleation in the area. Although the nucleation rate is apparently not greatly affected, the growth rate for regions with a dopant concentration higher than $10^{19}/cm^3$ is significantly increased. Thus, any spontaneous nucleation is followed by rapid crystallization, and full crystallization results from a lesser number of nucleations, making for larger grain size.

Figure 1B:
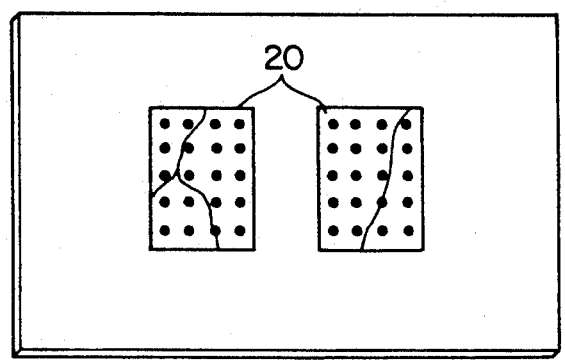
Figure 1C:
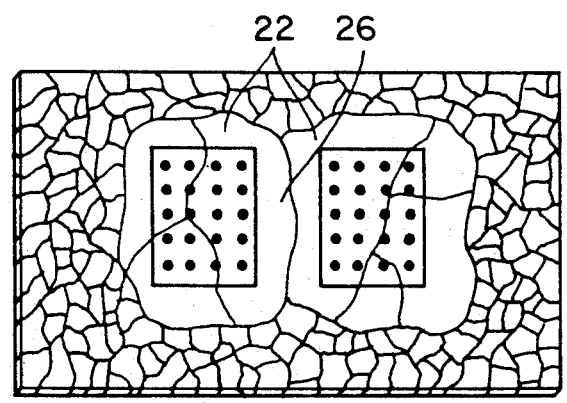

FIG. 1B shows a typical grain growth in the doped regions 20. The remaining portions of the amorphous silicon will begin to nucleate spontaneously, but will crystallize at a much slower rate than the doped regions. The faster growth rate creates larger grains in the doped regions. The grain formations in the doped region continue to grow out of the doped area while the undoped area crystallizes. The larger grain structure 22 extends into the undoped region approximately 1 $\mu$m by the time the crystallization process is complete. The results of the process are shown in FIG. 1C. The grain boundaries shown in the diagram are just possible grain formations and are intended only to demonstrate the Impurity Induced Seeding principle.

Figure 1D:
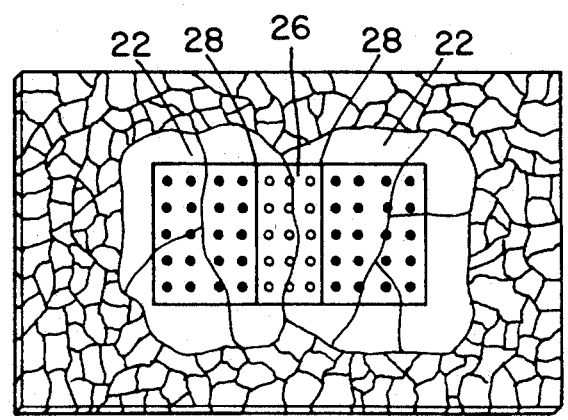
Figure 2A:
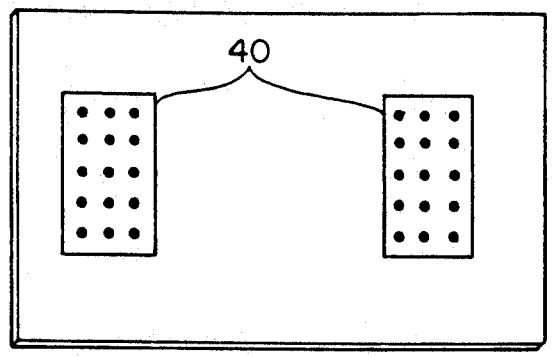
FIGS. 2A–2D show the fabrication of a polycrystalling semiconductor device with improved electrical characteristics, but low device-to-device variation.
Figure 2B:
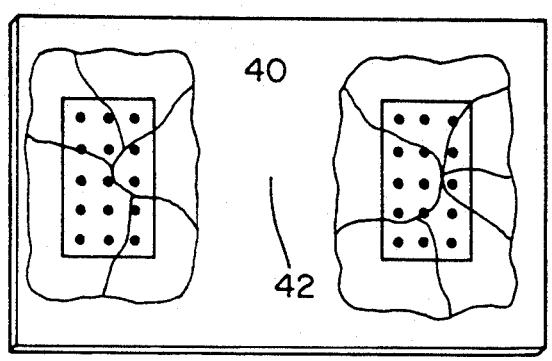
Figure 2C:
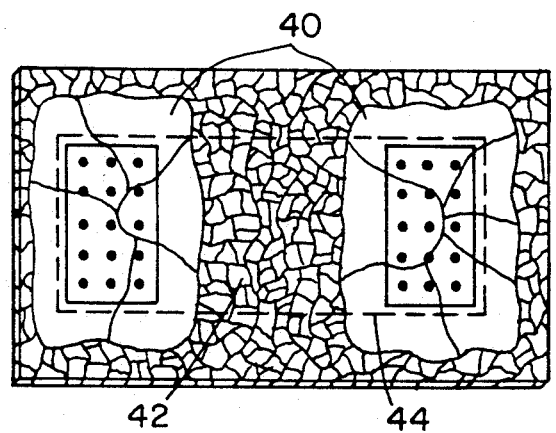
Figure 2D:
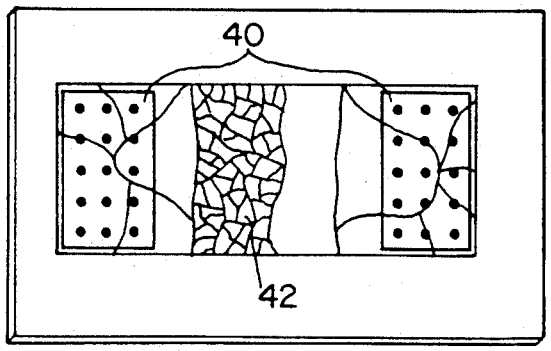

With the two existing conductivity junctions of FIG. 1C, a gate can be added to the channel region 26 to create a field-effect transitor. The material may also be masked, except for the channel region 26, and a dopant of different electrical characteristic added to create a bipolar device as shown in FIG. 1D.

The crystallization behavior of doped and undoped amorphous silicon must be understood in order to predict the granular structure resulting from Impurity-Induced Seeding.

As in other unseeded amorphous systems, crystallization is from the growth of grains which nucleate spontaneously. The spontaneous nucleation rate $r_n$ is defined as the number of grains per unit amorphous volume per unit time. In amorphous silicon films and in amorphized silicon films (polycrystalline film which has been heavily implanted) $r_n$ has been characterized as a function of anneal temperature, but not as a function of doping. The growth rate $v_g$ has been characterized as a function of anneal temperature and doping. Specifically, high concentrations of some impurities (larger than $10^{19}/cm^3$) can enhance the growth rate by a factor of ten. Preliminary evidence indicates that the nucleation rate $r_n$ is not greatly affected by doping. In a homogeneous film, the crystallization time $t_C$ is given by:

$$t_C = [(\pi/3)v_g^2 \alpha r_n]^{-\frac{1}{3}} \tag{1}$$

where $\alpha$ is the film thickness. The final grain area $A_G$ is given by:

$$A_G = 1.14[v_g/(\alpha r_n)]^{\frac{2}{3}} \tag{2}$$

The final grain size in undoped silicon films crystallized at 600° C. is on the order of 1.5-2 $\mu$m. Assuming the nucleation rate is not significantly different at high doping concentrations and the growth rate is enhanced by a factor of ten, from equation (2), the final grain size in heavily-doped silicon films crystallized at 600° C. should be 3-4 $\mu$m. Also, the crystallization time according to Equation (1) is nearly five times faster for heavily-doped silicon.

For impurity-induced seeding, the film is not homogeneous. It consists of lightly-doped and heavily-doped regions. Away from a boundary between the regions, crystallization follows Equations (1) and (2). However, since the crystallization time for heavily-doped silicon is five times faster than for lightly-doped silicon, the heavily-doped region crystallizes and seeds nearby lightly-doped regions before they have a chance to crystallize by spontaneous nucleation.

The crystalline fraction $\chi$ as a function of anneal time t is:

$$\chi = 1 - \exp(-t^3/t_C^3) \tag{3}$$

where $t_C$ is given in Equation (1). Quantitatively, when heavily-doped silicon is nearly 90% crystalline, undoped silicon is less than 2% crystalline. The average seeding distance is estimated by assuming that the heavily-doped region is crystallized at time $t=0$ so that the average distance that a seed from the heavily-doped region will grow is:

$$L = \int [1 - \chi(t)]v_g dt \tag{4}$$

This evaluates to approximately the same value as the grain size in the lightly-doped region, that is 1.5-2 $\mu$m. If two heavily-doped regions 20 are within 2 $\mu$m of each other, as is the case in FIG. 1C, the entire channel region between them is seeded. The probability of the channel being single or double crystal increases as the channel length is decreased. For the doped semiconductor of FIG. 1, a double crystal channel region is much more probable than a single crystal channel. If the channel region were double crystal, as shown in FIG. 1C, doping the channel region 26 then produces a transistor, with only a single grain boundary in the channel. FIG. 1D shows a typical example of this case. Terminals can be added to make the device operational. A device fabricated in this manner has better electrical characteristics than an ordinary polycrystalline semiconductor device, due to the reduced number of grain boundaries.

A variation of the Impurity-Induced Seeding process is demonstrated in FIG. 2. FIG. 2A shows heavy doping in two regions 40 which are further than 2 $\mu$m apart. The large grain structure grows out about 1 $\mu$m around the doped regions 40 as shown in FIG. 2B. The remainder of the material crystallizes in small grains by spontaneous nucleation. FIG. 2C shows a typical grain growth over the whole material. The channel region 42 between the doped regions 40 may now be doped with a dopant of different electrical characteristics than the first, if a transistor is desired. The dashed line 44 indicates the portion of the device to be masked while the remainder of the material is etched away. FIG. 2D shows the final grain structure of the device. The large grain structure surrounds the electrical junctions, providing improved electrical characteristics. The large number of grain boundaries within the channel region 42 prevents wide variations in channel mobilities from device to device. This allows for tighter tolerances while still ensuring few grain boundaries in the vicinity of the electrical junctions.

Figure 3A:
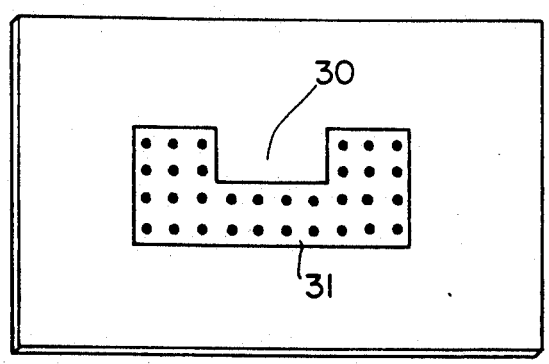
FIGS. 3A–3D show an Impurity-Induced Seeding method which can result in a single-crystal device.
Figure 3B:
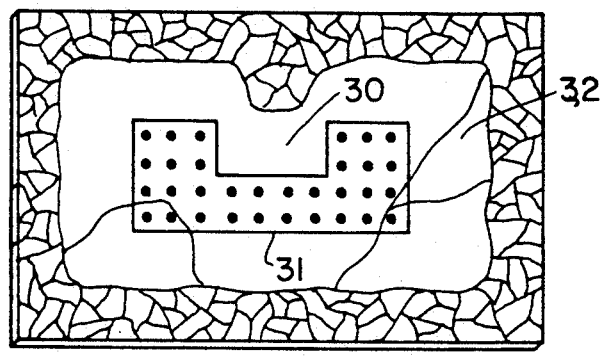
Figure 3C:
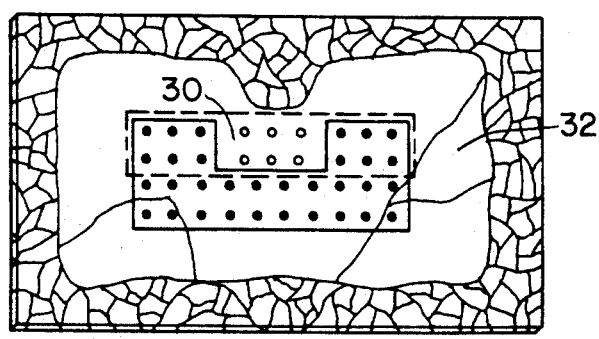
Figure 3D:
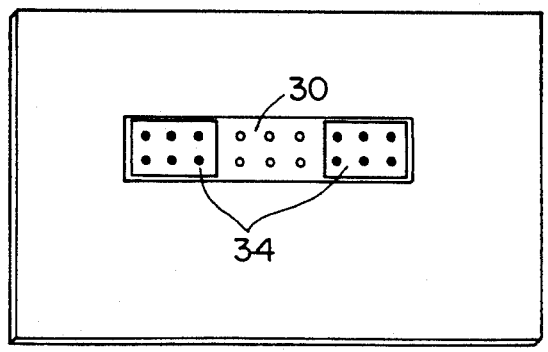

In another version of the Impurity-Induced Seeding method, a small transistor is formed which is potentially of a single crystal. This technique is demonstrated in FIGS. 3A through 3D. FIG. 3A shows an area of heavy doping 31 on a piece of amorphous silicon. The material is then crystallized by a low-temperature anneal. The larger crystal grain structure extends approximately 1 $\mu$m into the undoped region on all sides of the doped region. If the area 30 between the two extensions is less than 1 $\mu$m wide, as shown in FIG. 3A, the larger grain structure covers the whole region 30 between the two extensions. Within the larger grain structure, the two extensions and the region 30 in between may be located within one crystal grain, as indicated in FIG. 3B. A mask resistant to etching is then placed over the region indicated by dashed line 32 of FIG. 3C, and the rest of the semiconductor is removed with an etching solution. The mask is then removed, and an impurity-resistant mask is then applied to the remaining doped regions 34. The region 30 is then doped with an impurity of different electrical type than the original dopant. The addition of the new doping material creates conductivity junctions between regions 30 and 34. FIG. 3D shows the final device, which is single crystal if the grain boundaries formed with the larger grain area do not cross into regions 30 or 34. A small transistor formed within a single grain using this method has electrical characteristics superior to those of a polycrystalline device on the same scale.

FIG. 4 shows a 1 $\mu m \times 1$ $\mu m$ channel 35 between two heavily-doped regions 37 to be used in a self-aligned process. FIG. 4A shows typical resulting grain boundaries when the anneal is performed before the dopant is implanted, and FIG. 4B shows typical resulting grain boundaries when the anneal is after implantation. Computer simulation provides the final position of grain boundaries for the two cases. The simulation uses the same nucleation events for both cases, but the impurity-induced seeding growth rate is used when the dopant is implanted before crystallization. It is obvious from the figures that some nucleation events do not occur in the impurity-induced seeding simulation. This is because at the time designated for a particular nucleation event, the position for that nucleation event may have become crystallized due to the increased growth rate of another grain. Several simulations show that with impurity-induced seeding, the structure of FIG. 4 results in a single grain boundary separating the two doped regions 37 approximately 80% of the time. Without impurity-induced seeding, the channel 35 is single-crystal 40% of the time and contains a grain boundary 40% of the time. For this structure, impurity-induced seeding results in a more consistent grain boundary topology, but results in a single-crystal channel only 1% of the time.

A grain boundary in the channel of a transistor which separates the source and drain increases the effective threshold voltage of the transistor. A grain boundary running from source to drain, on the other hand, has less of an effect. FIG. 5 shows a doping structure designed to take advantage of this principle. In this case, a 1 $\mu m \times 3$ $\mu m$ lightly-doped channel region 39 lies within a larger heavily-doped region 41. This structure results in grain boundaries running horizontally because it is more likely that grains will meet at the long dimension of the internal channel region 39. FIG. 5A is a typical grain structure when the heavily-doped region 41 is doped after crystallization, while FIG. 5B is typical of the final grain structure using impurity-induced seeding.

Figure 6A:
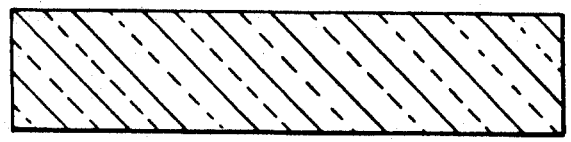
FIGS. 6A–6D show an Impurity-Induced Seeding method for the fabrication of thin-film vertical diodes.
Figure 6B:
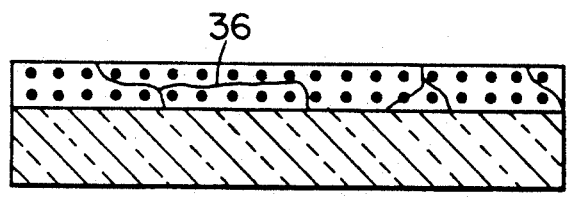
Figure 6C:
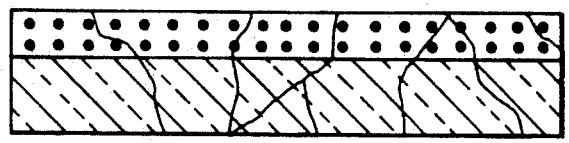

Impurity-Induced Seeding may also be used in the fabrication of thin-film vertical devices such as solar cells. The characteristics of the vertical diodes are improved by reducing the number of grain boundaries in the device. FIG. 6A shows the side view of a semiconductor film which is less than 1 $\mu m$ thick. The surface of the film 36 is heavily doped, inducing fast grain growth as shown in FIG. 6B. Since the film is thinner than the approximate distance that the larger grain structure extends into the undoped area, the whole film takes on the larger grain characteristic as shown in FIG. 6C. Fewer grain boundaries makes for a vertical diode with better characteristics than an ordinary polycrystalline vertical diode of the same magnitude.

Figure 6D:
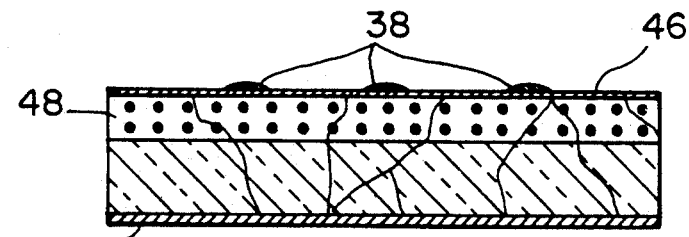

A typical solar cell made by this method is shown in FIG. 6D. Contact fingers 38 allow light to pass through an an anti-reflective coating 46 to the underlying diode structure. The conductivity junction 48 has fewer grain boundaries than an ordinary polycrystalline device, and the larger grain structure extends all the way down to the back contact 50. The improved grain structure of this solar cell results in an increased efficiency over conventional polycrystalline solar cells.

I claim:
1. A polycrystalline semiconductor device comprising:
   a conductivity junction contained within a single crystal grain of a first polycrystalline region of the semiconductor device, the first polycrystalline region having a structure of relatively large crystal grains; and
   a second polycrystalline region of the semiconductor device, the second polycrystalline region having a structure of relatively small crystal grains.
2. A device as claimed in claim 1 wherein said device is a silicon device.
3. A device as claimed in claim 1 wherein said device is fabricated on a semiconductor body having a substrate lying on a previously fabricated semiconductor body.
4. A device as claimed in claim 1 wherein said device includes a second conductivity junction within a third crystallized region of said semiconductor device, said third region having a grain structure like that of said first region and being separated from said first region by said second region.
5. A polycrystalline semiconductor device comprising:
   a conductivity junction contained within a first crystallized region of said semiconductor device, said first region having a structure of relatively large crystal grains; and
   a second crystallized region of said semiconductor device bordering said first region, said second region having a structure of relatively small crystal grains, said device being fabricated vertically within a semiconductor layer with said first region above said second region and said conductivity junction existing horizontally within said first region.
6. A method of forming a polycrystalline semiconductor body with a controlled grain structure comprising:
   providing an amorphous semiconductor material on a non-seeding substrate;
   adding impurities to predetermined discrete regions of the semiconductor material; and
   heating the semiconductor material to induce spontaneous nucleation throughout the material, the impurities providing a conductivity junction to be part of an active semiconductor device and enhancing the rate of crystallization in the discrete regions such that the spontaneous nucleation crystals of relatively large grain size form in discrete impurity-enhanced regions, spontaneous nucleation crystals of relatively small size form a polycrystalline region of the semiconductor device which has a structure of relatively small crystal grains outside the discrete impurity-enhanced regions, said large grain size crystals extending beyond the discrete impurity-enhanced regions such that the conductivity junction is contained within a single crystal grain of a polycrystalline region of the semiconductor device which has a structure of relatively large crystal grains.

7. A method as claimed in claim 6 wherein said impurities also provide a conductivity junction to be part of an active semiconductor device.

8. A method as claimed in claim 6 wherein said heating process is a low-temperature process.

9. A method as claimed in claim 6 wherein said semiconductor is formed on a non-seeding substrate.

10. A method as claimed in claim 6 wherein said semiconductor material is silicon.

11. A method as claimed in claim 6 wherein said semiconductor material is deposited in a polycrystalline state and amorphized by ion implantation.

12. A method as claimed in claim 6 wherein said impurities include phosphorus.

13. A method as claimed in claim 6 wherein said impurities include arsenic.

14. A method as claimed in claim 6 wherein said impurities include boron.

15. A method as claimed in claim 6 wherein said impurities are added by ion implantation.

16. A method as claimed in claim 6 wherein said impurities are added by diffusion through the surface of said semiconductor material.

17. A method as claimed in claim 6 wherein said semiconductor material is masked before adding said impurities.

* * * * *